United States Patent
Kawahara et al.

[11] Patent Number: 6,117,482
[45] Date of Patent: Sep. 12, 2000

[54] METHOD AND APPARATUS FOR MONITORING CVD LIQUID SOURCE FOR FORMING THIN FILM WITH HIGH DIELECTRIC CONSTANT

[75] Inventors: Takaaki Kawahara; Tsuyoshi Horikawa; Masayoshi Tarutani; Mikio Yamamuka, all of Hyogo, Japan

[73] Assignee: Mitsubishi Denki Kabushiki Kaisha, Tokyo, Japan

[21] Appl. No.: 09/089,491

[22] Filed: Jun. 2, 1998

[30] Foreign Application Priority Data

Dec. 5, 1997 [JP] Japan ................................. 9-335656

[51] Int. Cl.[7] ............................... B05D 5/12; C23C 16/06
[52] U.S. Cl. ......................... 427/10; 427/79; 427/126.3; 427/255.19; 427/255.28; 427/255.32; 438/14
[58] Field of Search ..................... 118/689, 690, 118/712; 427/8, 10, 126.3, 255.19, 255.28, 255.32; 438/14

[56] References Cited

U.S. PATENT DOCUMENTS

| | | |
|---|---|---|
| 3,670,172 | 6/1972 | Golden ............................. 250/43.4 R |
| 5,372,850 | 12/1994 | Uchikawa et al. . |
| 5,776,254 | 7/1998 | Yuuki et al. ............................. 118/725 |

FOREIGN PATENT DOCUMENTS

| | | |
|---|---|---|
| 6-310444 | 11/1994 | Japan . |
| 7-268634 | 10/1995 | Japan . |
| 8-176826 | 7/1996 | Japan . |
| 8-186103 | 7/1996 | Japan . |
| 9-219497 | 8/1997 | Japan . |

OTHER PUBLICATIONS

"Surface Morphologies and Electrical Properties of (Ba, Sr)TiO$_3$ Films Prepared by Two–Step Deposition of Liquid Source Chemical Vapor Deposition", T. Kawahara et al., Jpn. J. Appln. Phys. vol. 34 (1995) pp. 5077–5082.

Primary Examiner—Brian K. Talbot
Attorney, Agent, or Firm—McDermott, Will, Emery

[57] ABSTRACT

An object is to provide a method of monitoring a CVD liquid source for forming a thin film having a high dielectric constant, which allows detection of the concentration abnormality and the deterioration of the CVD liquid source. First, the CVD liquid source used as a sources of chemical vapor deposition is prepared by dissolving an organometallic compound of dipivaloyolmethane type in an organic solvent. Secondly, a spectroscopy of the CVD liquid source is performed.

6 Claims, 4 Drawing Sheets

METHOD AND APPARATUS FOR MONITORING CVD LIQUID SOURCE FOR FORMING THIN FILM WITH HIGH DIELECTRIC CONSTANT

BACKGROUND OF THE INVENTION

1. Field of the Invention

The present invention relates generally to a method of monitoring a CVD liquid source used for forming a thin film having a high dielectric constant, and more particularly to a method of monitoring a CVD liquid source for forming a thin film having a high dielectric constant, in order to detect presence of abnormal concentration and deterioration of the CVD liquid source.

The present invention relates further to an improved monitoring apparatus for a CVD liquid source allowing the detection of presence of abnormal concentration and deterioration of the CVD liquid source.

2. Description of the Background Art

Recently the degree of integration of semiconductor memories and devices has been rapidly increasing. In a dynamic random access memory (DRAM), for example, a device capacity (bit number) has increased at an astonishing rate of four-fold in three years. An object to increase the integration of devices is the reduction of power consumption, cost and so on. Regardless of the higher degree of integration, however, a capacitor, a component of a DRAM, must maintain a certain capacity. For this purpose, it is necessary to reduce the thickness of a film used as a capacitor, which is unachievable when a conventional material, that is, $SiO_2$, is used. A larger capacity can be obtained by increasing the dielectric constant of a film by using a different material from those employed heretofore as well as by reducing the film thickness. Thus studies for utilizing the materials having a high dielectric constant for a memory device are now enthusiastically conducted.

As long as a material having a high dielectric constant is used, a leakage current and the thickness of a film must be minimized. Generally, it is desirable that the film thickness is at most 0.5 nm in $SiO_2$ equivalent and that a leakage current density at the application of 1V is at most $2 \times 10^{-7}$ A/cm$^2$.

The conventional method has a drawback when it is employed for forming a thin film over a capacitor electrode of a DRAM having a step such as shown in FIG. 5.

Referring to FIG. 5, a DRAM includes a semiconductor substrate 1, on which an interlayer insulation film 2 is formed. A storage node 3 is formed on interlayer insulation film 2. A contact hole 4 is formed in interlayer insulation film 2 in order to connect storage node 3 and semiconductor substrate 1, which are connected by a conductive material filled in contact hole 4. A capacitor insulation film 5 is formed on interlayer insulation film 2 such that it covers storage node 3. A cell plate 6 coats storage node 3, and capacitor insulation film 5 is posed therebetween.

For forming a thin film over a capacitor electrode of a DRAM having a step, as shown in FIG. 5, a CVD method is regarded as the most advantageous, which attains a good coverage to a body with a complicated configuration. Sources used for the method, however, do not have a stable and favorable vaporization characteristic. The heat-induced vaporization characteristic of dipivaloylmethane (DPM) compound of β-diketon type, which is commonly used as a CVD material, is not preferable.

Against the above-described background, the present inventors found a novel CVD source having a dramatically improved vaporization characteristic and being produced by dissolving a conventional solid material in an organic solvent called tetrahydrofuran (THF). When a conventional CVD apparatus for a liquid source, forming a $SiO_2$ film is used, however, a good dielectric film is not always acquired from this novel source. Thus a novel CVD apparatus for a liquid source was proposed which allows a sufficient vaporization and constant feeding of a liquid source to a reaction chamber (Japanese Patent Laying-Open No. 6-310444). In addition the inventors have found that a coverage can be surprisingly improved by changing a Ti material from TTIP (Ti(O-i-Pr)$_4$) commonly used as a Ti material to TiO(DPM)$_2$ of DPM type. The inventors have further found that, compared with a single-layer film, a two-step films deposition is effective in order to attain a good surface morphology and electric characteristics, in which a second layer of a film is deposited over a first one crystallized by annealing at the starting phase of film deposition where the film being formed is likely to have a relatively amorphous feature. (Japanese Patent Laying-Open No. 7-268634).

Additionally the installation of a FT-IR, for example, to the CVD apparatus for a liquid source is proposed in order to allow an optical in-situ monitoring of film deposition. A lower electrode structure suitable for the deposition of a BST film (which includes Ba, Sr and Ti) by the liquid source CVD method were also found (Japanese Patent Laying-Open Nos. 8-176826 and 8-186103).

It was found, however, that the dielectric films formed by employing the liquid source CVD apparatus do not always have a stable and favorable film quality (including electric characteristics).

FIG. 6 is a schematic diagram of an example of a liquid source CVD apparatus as the one disclosed in Japanese Patent Laying-Open No. 9-219497.

Referring to FIG. 6, the liquid source CVD apparatus includes a reaction chamber 22 which houses a substrate 24 to be heated by a substrate heater 23. A reactive gas supplying tube 20 is connected to reaction chamber 22. A heater 21 is also attached to reaction chamber 22. Reaction chamber 22 and a vaporizer 12 are mutually connected by a transport tube 17. Transport tube 17 is provided with a heater 18 for heating transport tube 17.

Vaporizer 12 is provided with a source gas supplying outlet 19 and a heater 16 for heating vaporizer. The liquid source CVD apparatus includes a liquid source vessel 13 having a pressure tube 25. A liquid source feeder 14 is attached to liquid source vessel 13. The liquid source CVD apparatus also includes a solvent vessel 28.

Pressure tube 25 and a solvent feeder 29 are attached to solvent vessel 28. The liquid source CVD apparatus is provided with a carrier-gas introducing tube 26 having a carrier-gas volume controller 27. Liquid source, solvent and carrier-gas are introduced to vaporizer 12 through an vaporization nozzle 15.

The operation of the liquid source CVD apparatus shown in FIG. 6 will then be described. Carrier-gas flows with its flow rate controlled by carrier-gas volume controller 27. The liquid source in liquid source vessel 13 is introduced thereto while being pressurized by pressure tube 25 and controlled by liquid source feeder 14 and, sprayed into vaporizer 12 via vaporization nozzle 15. Source gas vaporized in vaporizer 12 is supplied from source gas supplying outlet 19 through source gas transport tube 17 to reaction chamber 22. While source gas is in source gas transport tube 17, it is heated by heater 18. In reaction chamber 22 source gas is reacted with an oxidizing agent ($O_2$) whereby a film with a high dielectric constant (a BST film, for example) is formed on substrate 24. Three liquid source supplying systems of Ba, Sr and Ti each including elements 13 and 14 are provided, although not shown in FIG. 6. Liquid source from these three systems are together supplied to vaporizer 12. Reaction chamber is filled with an $O_2$ atmosphere and pressure is set in the range from 1 to 15 Torr. A substrate temperature in reaction chamber 22 is set in a relatively low range of 400 to 600° C. by the heater because a favorable coverage is obtained at a lower temperature. The flow rate of sources and the time for film deposition are controlled as to produce a film with the thickness of 300 Å and the BST film composition ratio of (Ba+Sr)/Ti=1.0 at the film deposition rate of about 30 Å/min. An upper electrode Pt or Ru with a diameter of approximately 1 mm is formed by sputtering on a BST film which is formed on a lower electrode Pt or Ru, whereby electric characteristics, that is, a leakage current, equivalent $SiO_2$ film thickness and so on, are measured.

The foregoing is the description of a conventional fabrication procedure of a thin film having a high dielectric constant.

When a CVD method is employed to form a BST film using a liquid source produced by dissolving an organometallic compound of DPM type in an organic solvent, however, the quality of the BST film is subjected to an abrupt change at the time of the replacement of a vessel of the CVD liquid source. Even when the same CVD liquid source is used, the quality of BST films fluctuates because of the deterioration of the liquid source. These are some of the reasons a film having a stable and favorable quality (including electric characteristics) cannot be obtained.

SUMMARY OF THE INVENTION

An object of the present invention is to provide an improved method of monitoring a CVD liquid source for forming a thin film having a high dielectric constant, allowing a convenient checking of concentration abnormality and deterioration of the CVD liquid source.

Another object of the invention is to provide an apparatus for monitoring a CVD liquid source for forming a thin film having a high dielectric constant allowing the implementation of the above mentioned monitoring method.

In a method of monitoring a CVD liquid source for forming a thin film having a high dielectric constant according to a first aspect, a spectroscopy of a CVD liquid source used as a source for chemical vapor deposition and produced by dissolving an organometallic compound of dipivaloylmethane type in an organic solvent is performed.

In accordance with the invention, concentration abnormality and deterioration of the CVD liquid source can be detected through the spectroscopy of the CVD liquid source used as a source for the chemical vapor deposition.

In accordance with a second aspect, in a method of monitoring a CVD liquid source for forming a thin film having a high dielectric constant, the concentration abnormality and the deterioration of the liquid source in a vessel can immediately be detected because the spectroscopy of the CVD liquid source is carried out simultaneously with the chemical vapor deposition using the CVD liquid source in operation.

In accordance with a third aspect, in a method of monitoring a CVD liquid source for forming a thin film having a high dielectric constant, a metal included in the organometallic compound of dipivaloylmethane type is selected from the group consisting of Ba, Sr, Ti, Ta, Pb, Zr and Bi. Thus the concentration abnormality and the deterioration of the CVD liquid source including the organometallic compound of dipivaloylmethane type including Ba, Sr, Ti, Ta, Pb, Zr and Bi can be detected.

In accordance with a fourth aspect, in a method of monitoring a CVD liquid source for forming a thin film having a high dielectric constant, a metal included in the organometallic compound of dipivaloylmethane type is selected from the group consisting of Ba, Sr and Ti. Thus, the concentration abnormality and the deterioration of the CVD liquid source for BST films can be detected.

In accordance with a fifth aspect, in a method of monitoring a CVD liquid source for forming a thin film having a high dielectric constant, the organic solvent includes tetrahydrofuran (THF). Thus the concentration abnormality and the deterioration of the CVD liquid source produced by dissolution in THF can immediately be detected.

In accordance with a sixth aspect, in a method of monitoring a CVD liquid source for forming a thin film having a high dielectric constant, butyl acetate is used as the organic solvent. Thus the concentration abnormality and the deterioration of the CVD liquid source produced by dissolution in butyl acetate can immediately be detected.

In accordance with a seventh aspect, in a method of monitoring a CVD liquid source for forming a thin film having a high dielectric constant, alcohols are used as the organic solvent. Thus the concentration abnormality and the deterioration of the CVD liquid source produced by dissolution in alcohols can immediately be detected.

In accordance with an eighth aspect, an apparatus of monitoring a CVD liquid source is attached to a vessel storing a liquid source produced by dissolving an organometallic compound of dipivaloylmethane type in an organic solvent. A quartz cell is attached to the vessel, to which the liquid source from the vessel is injected. The apparatus of monitoring is provided with a device for performing the spectroscopy of the liquid source injected to the quartz cell.

In accordance with the invention, the concentration abnormality and the deterioration of the liquid source can immediately be detected because the device for performing the spectroscopy of the liquid source injected to the quartz cell is provided.

In accordance with a ninth aspect, in the apparatus of monitoring a CVD liquid source, the device for performing the spectroscopy includes a light source and a detector arranged on opposing sides of the quartz cell.

According to the invention, the concentration abnormality and the deterioration of the liquid source in the vessel can be observed in-situ by transmitting a UV-VIS ray to the quartz cell because the light source and the detector are arranged on opposing sides of the quartz cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In a method of monitoring a CVD liquid source for forming a thin film having a high dielectric constant according to the invention, an ultraviolet visible (UV-VIS) ray is transmitted through a CVD liquid source being under use and in a CVD liquid source vessel made of SUS (steel use stainless) and of which interior was unobservable. Through the observation of absorption spectrum of a UV-VIS ray, an immediate detection of the concentration abnormality and the deterioration of the CVD liquid source is possible. This in turn allows an immediate identification of the cause of a BST film quality degradation. In addition, the fluctuation of BST film quality can be minimized by the replacement of the CVD liquid source immediately after detecting the deterioration of the CVD liquid source. Thus a stable BST film can be formed. Now, referring to the preferred embodiments, the invention will be described hereinafter.

FIRST EMBODIMENT

Figure 1:
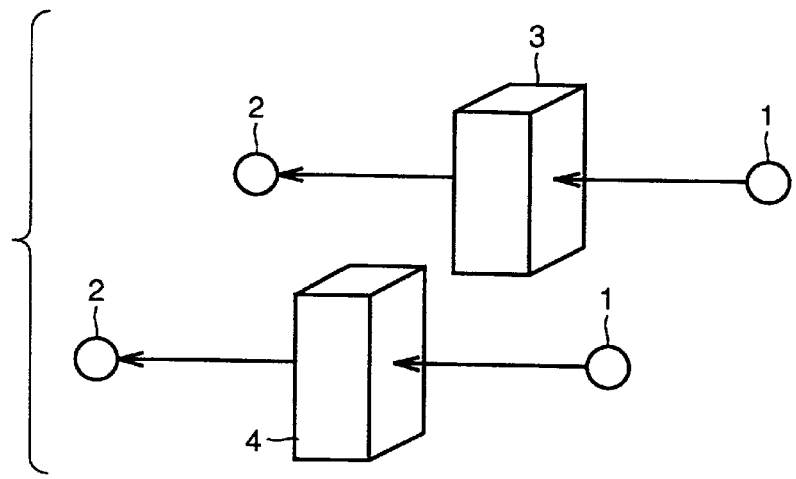
FIG. 1 is a diagram illustrating a method of monitoring a CVD liquid source for forming a thin film having a high dielectric constant according to a first embodiment.

FIG. 1 is a diagram illustrating a concept of the method of monitoring a CVD liquid source for forming a thin film having a high dielectric constant according to the first embodiment. On opposing sides of a liquid cell 3 for reference, a UV-VIS light source 1 and a detector 2 are arranged, respectively. On opposing sides of a liquid cell 4 for sample, a UV-VIS light source 1 and a detector 2 are provided, respectively. A liquid under use and encapsulated in a CVD liquid source vessel is injected into sampling liquid cell 4. The CVD liquid source vessel is installed to a CVD apparatus for forming a thin film having a high dielectric constant.

Injected into reference liquid cell 3 is a solvent, THF, which can be replaced with butyl acetate or alcohols. By the operation of UV-VIS light source 1 and detector 2, the absorption spectroscopy of the ultraviolet-visible (UV-VIS) ray is carried out.

Figure 2:
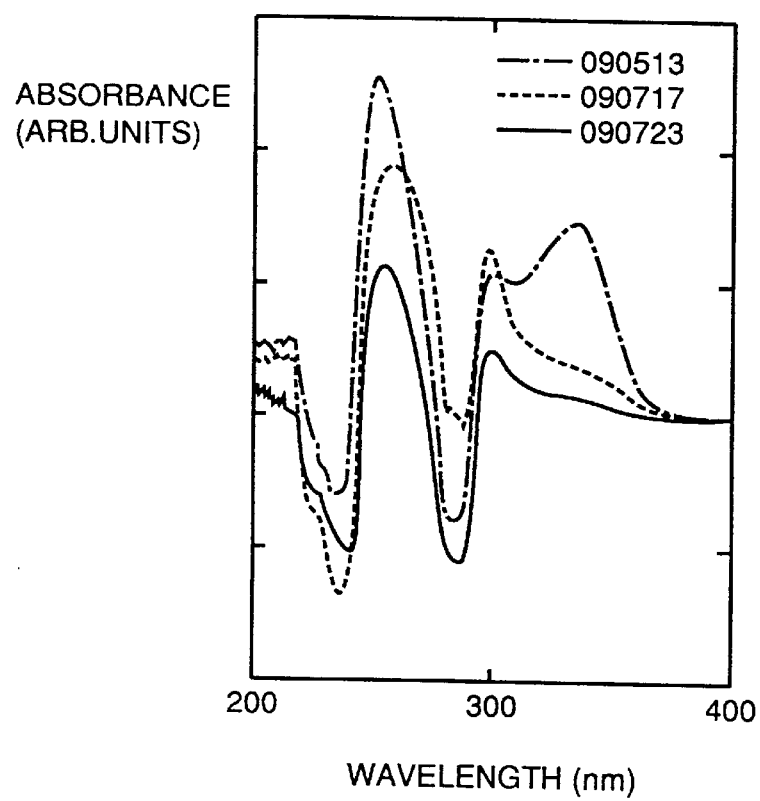
FIG. 2 is a diagram of UV-VIS absorption spectrum showing a change on standing of $TiO(DPM)_2$/THF solution of $1\times10^{-4}$ mols/L.

FIG. 2 is a diagram of spectrum showing the results of the measurement of TiO(DPM)$_2$/THF solution of $1 \times 10^{-4}$ mols/L in the range of 190 to 400 nm. An absorption peak of 332 nm results from an undecomposed Ti-DPM. It has been found that an absorption peak of an undecomposed Ti-DPM is decayed with the passage of time. The reason is assumed to be the degradation of Ti-DPM bond due to the effect of water contained in an atmosphere. Thus it has been found that the observation of a UV-VIS spectrum shape allows the determination of the degrees of concentration fluctuation and deterioration of the CVD liquid source. Thus the identification of the cause of BST film quality degradation is possible.

SECOND EMBODIMENT

Figure 3:
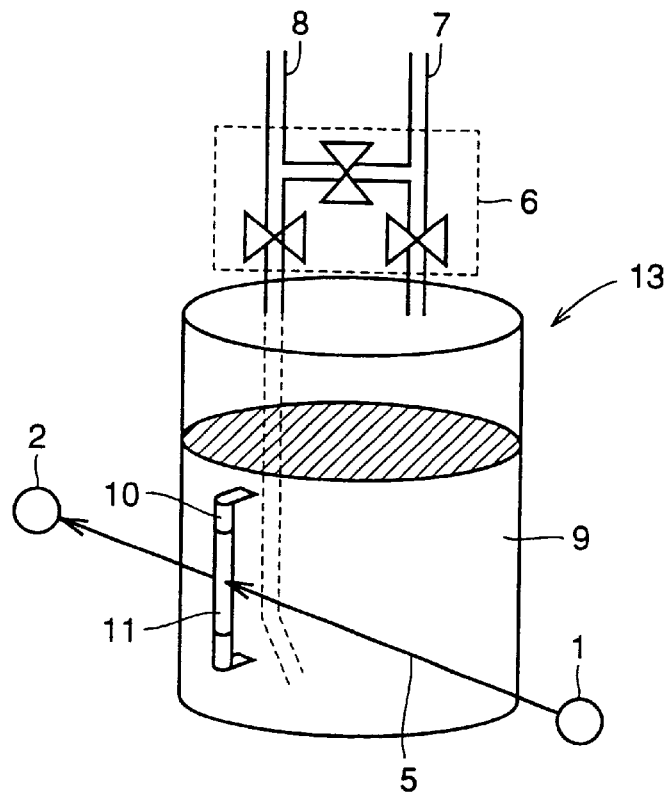
FIG. 3 is a diagram illustrating a concept of an apparatus of monitoring a CVD liquid source for forming a thin film having a high dielectric constant according to a second embodiment.
Figure 6:
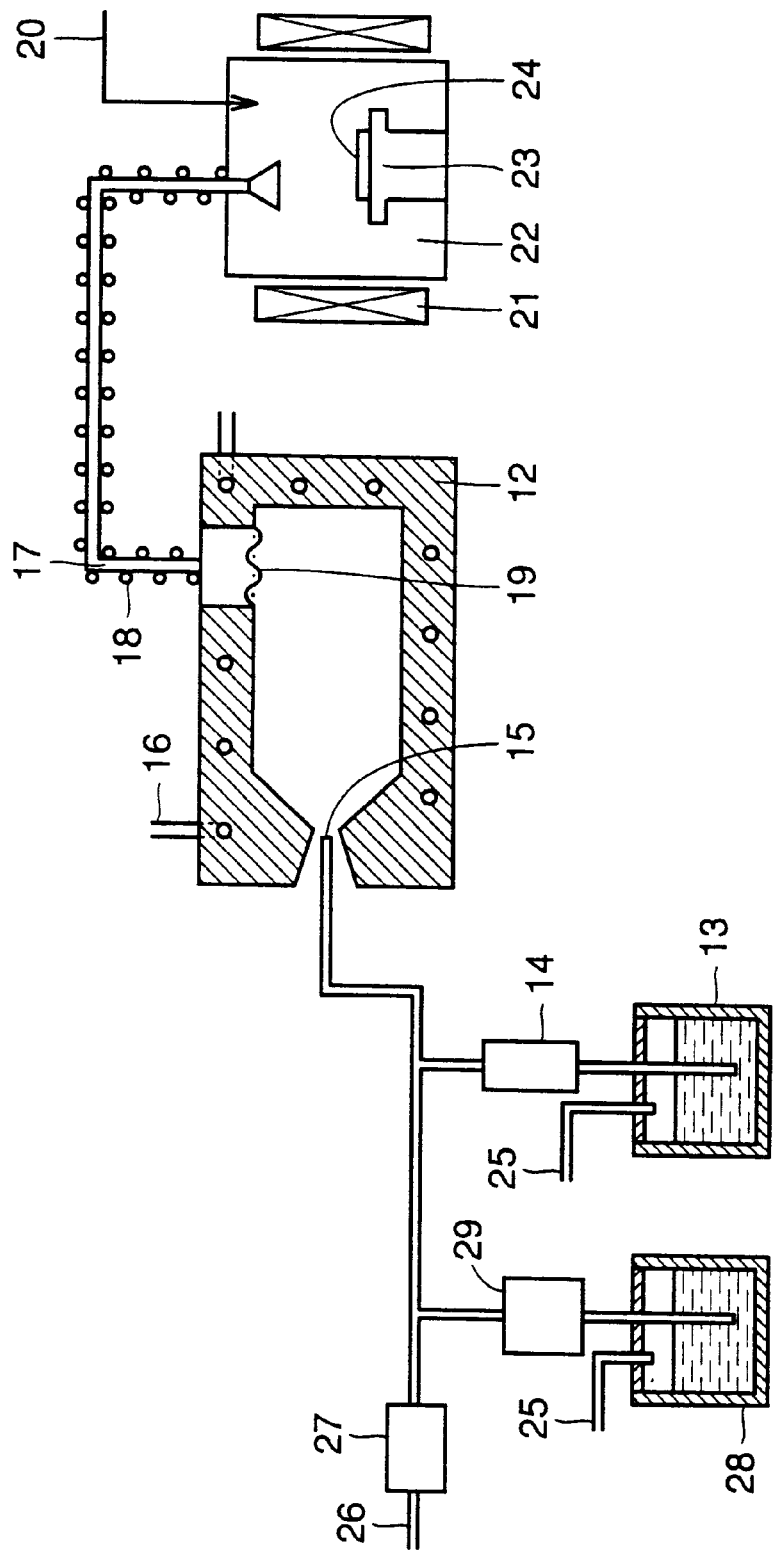
FIG. 6 is a diagram illustrating a concept of a conventional CVD apparatus for forming a thin film having a high dielectric constant.

FIG. 3 is a diagram showing a concept of an apparatus of monitoring a CVD liquid source for forming a thin film having a high dielectric constant according to the second embodiment. A CVD liquid source vessel 13 corresponds to conventional CVD liquid source vessel 13 shown in FIG. 6. A monitoring quartz cell 11 is attached to CVD liquid source vessel 13 via a welded-pipeline 10 for monitoring. A UV-VIS light source 1 and a detector 2 are arranged on opposing sides of quartz cell 11.

The absorption spectroscopic analysis of the CVD liquid source is performed using a UV-VIS ray 5 from UV-VIS light source 1 incident upon quartz cell 11. Thus an in-situ observation of the CVD liquid source under use is allowed. Further by this method, an immediate detection of the concentration abnormality and the deterioration of the liquid source in the vessel is allowed. Immediate replacement of the CVD liquid source to a new one upon detecting abnormality or deterioration allows the minimization of film quality fluctuation and thus in turn the manufacture of a film having a high dielectric constant and the stable quality.

In the above described embodiments, descriptions are made of a CVD liquid source used for forming a capacitor insulation film in a DRAM as an example, but this is exemplary only and not limiting in any sense. The present invention can also be applied to a formation of an insulation film of a non-volatile memory as is apparent from reference to FIG. 4.

Figure 4:
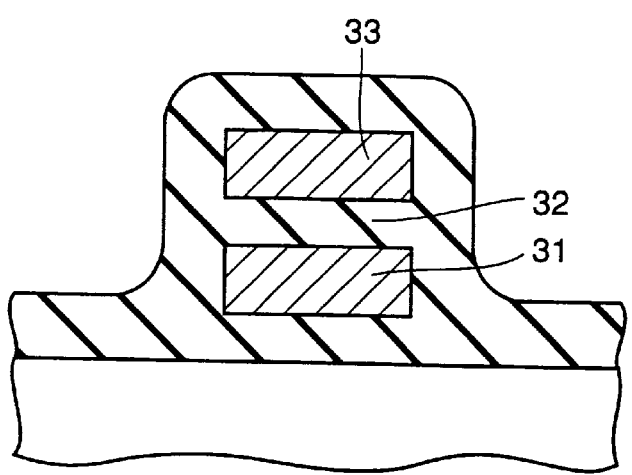
FIG. 4 is a sectional view of a non-volatile memory.
Figure 5:
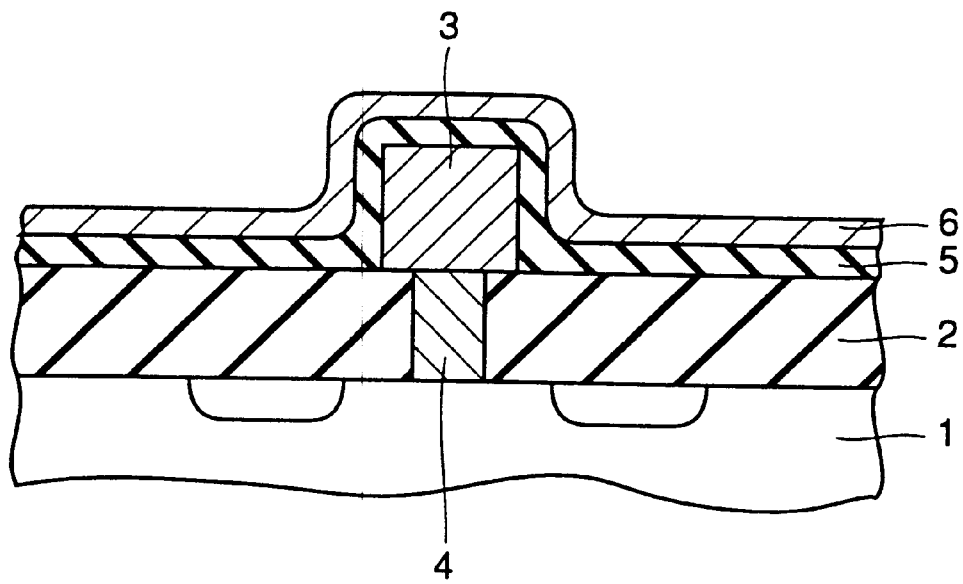
FIG. 5 is a sectional view of a DRAM.

With reference to FIG. 4, formed on a semiconductor substrate 30 is a floating gate 31, on which a control gate 33 is formed with an insulation film 32 posed therebetween. The present invention can also be employed as a method of monitoring a CVD liquid source used for forming insulation film 32.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a dielectric film comprising the steps of:

forming a dielectric film on a substrate by chemical vapor deposition (CVD) using a CVD liquid source which is produced by dissolving a dipivaloylmethane organometallic compound in an organic solvent;

detecting the concentration abnormality and the deterioration of said CVD liquid source in situ by performing a spectroscopy of said CVD liquid source under use; and replacing said CVD liquid source by a new one upon detecting abnormality or deterioration.

2. The method according to claim 1, wherein a metal included in said dipivaloylmethane organometallic compound is selected from the group consisting of Ba, Sr, Ti, Ta, Pb, Zr and Bi.

3. The method according to claim 2, wherein a metal included in said dipivaloylmethane organometallic compound is selected from the group consisting of Ba, Sr and Ti.

4. The method according to claim 1, wherein said organic solvent includes tetrahydrofuran.

5. The method according to claim 1, wherein said organic solvent includes butyl acetate.

6. The method according to claim 1, wherein said organic solvent includes alcohols.

* * * * *